US 6,627,937 B2

(12) United States Patent
Shinkawata

(10) Patent No.: US 6,627,937 B2
(45) Date of Patent: Sep. 30, 2003

(54) SEMICONDUCTOR MEMORY DEVICE

(75) Inventor: Hiroki Shinkawata, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,810

(22) Filed: May 31, 2002

(65) Prior Publication Data
US 2003/0095445 A1 May 22, 2003

(30) Foreign Application Priority Data
Nov. 22, 2001 (JP) ........................ 2001-357406

(51) Int. Cl.[7] ................. H01L 27/108; H01L 29/76; H01L 29/94; H01L 31/119
(52) U.S. Cl. ........................ 257/296; 257/371
(58) Field of Search .................. 257/296, 371

(56) References Cited
U.S. PATENT DOCUMENTS
5,386,135 A * 1/1995 Nakazato et al. .......... 257/369
6,097,078 A * 8/2000 Sim et al. ............... 257/548
6,388,295 B1   5/2002 Yamashita et al.

FOREIGN PATENT DOCUMENTS
JP      5-267606      10/1993
JP   2000-277629      10/2000
JP   2001-291779      10/2001

* cited by examiner

Primary Examiner—David Nelms
Assistant Examiner—Tu-Tu Ho
(74) Attorney, Agent, or Firm—McDermott, Will & Emery

(57) ABSTRACT

The present invention contemplates a highly reliable semiconductor memory device. The semiconductor memory device includes a silicon substrate containing a p impurity of a first concentration, an epitaxial layer formed at the silicon substrate and containing a p impurity having a second concentration lower than the first concentration, a memory region provided on the epitaxial layer, and a logic circuit region provided on the epitaxial layer at a location different from the memory region. The memory region includes a p well, an n well and a bottom well. The logic circuit region includes a complementary field effect transistor.

7 Claims, 14 Drawing Sheets

SEMICONDUCTOR MEMORY DEVICE

BACKGROUND OF THE INVENTION

1. Field of the Invention

The present invention relates generally to semiconductor memory devices and methods of manufacturing the same and particularly to semiconductor memory devices provided with a memory region and a logic circuit region and methods of manufacturing the same.

2. Description of the Background Art

In recent years, design technology and process technology have advanced and thus made it possible to mount conventionally separately manufactured, multiple integrated circuits on a single chip to fabricate a highly integrated circuit. Together with the high integration of integrated circuits is also pursued a rapid operation contributed to by mounting on a single chip. Semiconductor memory devices represented by dynamic random-access memory (DRAM;) have also been fabricated on the same chip as a high-level integrated logic circuit including microprocessing units (MPU). To fabricate such an integrated circuit, a plurality of metal oxide silicon (MOS) field effect transistors different in structure need to be incorporated in a single chip. A semiconductor memory device including memory cells and a logic circuit formed on a single substrate is disclosed for example in Japanese Patent Laying-Open No. 2001-291779.

FIG. 14 is a cross section of a conventional semiconductor memory device, as described in Japanese Patent Laying-Open No. 2001-291779. As shown in the figure, the conventional semiconductor memory device includes a semiconductor substrate 401, and a memory cell region 491, a logic circuit region 492 and a peripheral region 493 formed on semiconductor substrate 401.

Semiconductor substrate 401 includes a p or n impurity of approximately $1 \times 10^{15}$ cm$^3$. In a separate region is formed an isolation and insulation film 402 formed of silicon oxide film. Isolation and insulation film 402 separates a surface of semiconductor substrate 401 and impurity is introduced into the surface to provide an n well 437, p wells 441, 442, 443 and 444, and n bottom wells 321 and 431.

In memory cell region 491 p well 443 is deeper than n well 437 to allow a DRAM formed in p well 443 to have enhanced memory retention characteristics. Furthermore, p well 443 for holding memory is surrounded by n well 437 and n bottom well 431. P well 443 can thus have a potential set independently of semiconductor substrate 401 to reduce soft error. N well 437 is provided with a p MOS transistor (not shown) accommodating a different application and p wells 441 and 444 are provided with n MOS transistors (not shown), respectively, accommodating their respective applications.

The conventional semiconductor memory device as described above, however, is disadvantageous, as described hereinafter.

Bottom well 431 is initially formed on semiconductor substrate 401 having a low impurity concentration and in contact therewith p well 443 is formed. Although p well 443 is surrounded by n well 437 and bottom well 431, soft error can be introduced and thus impair the reliability of the semiconductor device.

Furthermore, logic circuit region 492 is provided with a plurality of field effect transistors which mutually configure a complementary MOS transistor (CMOS). In the FIG. 14 conventional structure at the CMOS latch-up is caused and thus impairs the reliability of the semiconductor memory device.

SUMMARY OF THE INVENTION

The present invention has been made to overcome the disadvantages described above.

One object of the present invention is to prevent soft error to provide a highly reliable semiconductor memory device.

Another object of the present invention is to prevent latch-up to provide a highly reliable semiconductor memory device.

In accordance with the present invention a semiconductor device includes: a semiconductor substrate containing an impurity of a first conductivity type having a first concentration; a semiconductor layer formed on the second substrate, having a main surface, and containing an impurity of the first conductivity type having a second concentration lower than the first concentration; a memory region provided on the semiconductor layer; and a logic circuit region provided on the semiconductor layer at a location different from the memory region. The memory region includes a first well region of the first conductivity type formed at the semiconductor layer and having a first bottom plane at a first depth as measured from the main surface, a second well region of a second conductivity type formed at the semiconductor layer to surround the first well region and having a second bottom plane at a second depth less deep than the first depth, as measured from the main surface, and a first bottom well region of the second conductivity type provided at the semiconductor layer in contact with the first and second bottom planes. The logic circuit region includes a complementary field effect semiconductor element formed on a main surface of the semiconductor layer.

In the semiconductor memory device of the present invention configured as described above a semiconductor layer containing an impurity of a first conductivity type having a relatively low concentration is formed on a semiconductor substrate containing an impurity of the first conductivity type having a relatively high concentration. Thus the substrate of the high concentration underlies the semiconductor layer of the low concentration and on the semiconductor layer are provided a memory region and a logic circuit region. Thus the memory region can be free of soft error. Furthermore, the logic circuit region, including a complementary field effect semiconductor element, can prevent the semiconductor element from latching up. A highly reliable semiconductor memory device can thus be provided.

Furthermore, a first well region having a first bottom plane positioned to be relatively deeper, as measured from a main surface, and a second well region having a second bottom plane positioned to be relatively less deep, as measured from the main surface, can be included and providing the first well region with a memory element can thus enhance the memory element's memory retention characteristics. Furthermore, the first well region of the first conductivity type can be surrounded by the second well region of the second conductivity type and a bottom well region of the second conductivity type and as a result the first well region can have a potential set independently to provide further enhanced resistance to soft error.

Preferably, the memory region includes a memory element formed at the first well region. The memory element includes dynamic random access memory. The memory element includes a capacitor. The logic circuit region includes a third well region of the first conductivity type provided in the semiconductor region and a fourth well region of the second conductivity type. The logic circuit region includes a field effect transistor formed in the third well region and having the second conductivity type and a field effect transistor formed in the fourth well region and having the first conductivity type. The fourth well region surrounds the third well region and the logic circuit region includes a second bottom well region provided in contact with the third and fourth well regions at their respective bottom planes and having the second conductivity type.

The present invention provides a method of manufacturing a semiconductor memory device including the steps of: epitaxially growing on a semiconductor substrate containing an impurity of a first conductivity type having a first concentration a semiconductor layer having a main surface and containing an impurity of the first conductivity type having a second concentration lower than the first concentration; forming a memory region on the semiconductor layer; and forming a logic circuit region on the semiconductor layer at a location different from the memory region. The step of forming the memory region including the step of forming a first well region of the first conductivity type formed at the semiconductor layer and having a first bottom plane at a first depth as measured from the main surface, a second well region of a second conductivity type formed at the semiconductor layer to surround the first well region and having a second bottom plane at a second depth less deep than the first depth, as measured from the main surface, and a first bottom well region of the second conductivity type provided at the semiconductor layer in contact with the first and second bottom planes. The step of forming the logic circuit region includes the step of forming a complementary field effect semiconductor element on a main surface of the semiconductor layer.

In the present method a semiconductor layer can be formed through epitaxial growth and its thickness, impurity concentration and crystal orientation can thus be controlled precisely. As a result, a highly reliable semiconductor memory device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present invention in embodiments will be described with reference to the drawings.

First Embodiment

Figure 1:
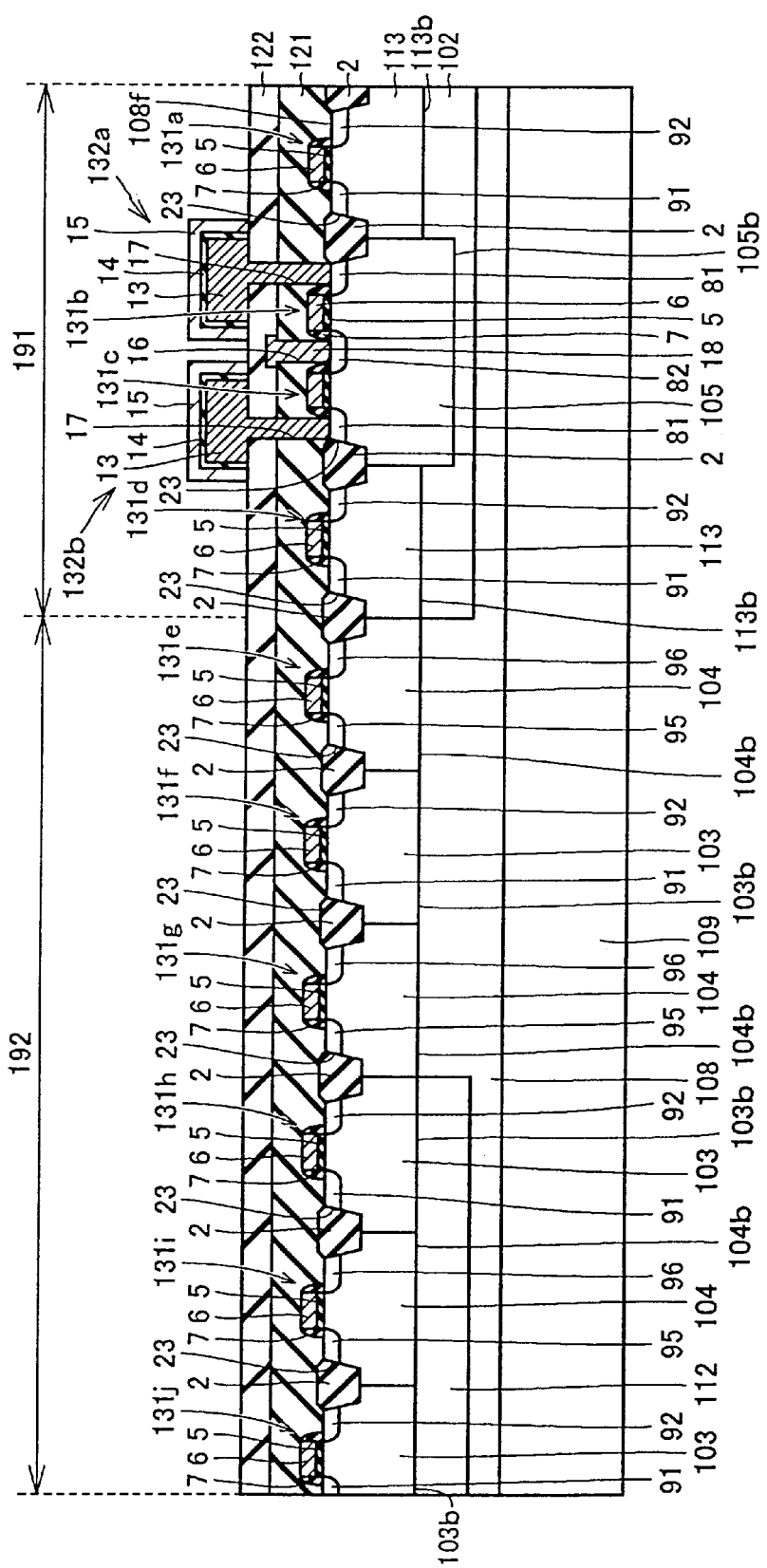
FIG. 1 is a cross section of a semiconductor memory device of the present invention in a first embodiment.

With reference to FIG. 1, the present invention in a first embodiment provides a semiconductor memory device including a silicon substrate 109 providing a semiconductor substrate containing boron serving as an impurity of a first conductivity type having a first concentration (of $1\times10^{19}$ cm$^{-3}$), an epitaxial layer 108 serving as a semiconductor layer, having a main surface 108f, and containing boron serving as an impurity of the first conductivity type having a second concentration (of $1\times10^{15}$ cm$^{-3}$) lower than the first concentration, a memory region 191 provided on epitaxial layer 108 and serving as a memory region, and a logic circuit region 192 provided on epitaxial layer 108 at a location different from memory region 191 to serve as a logic region.

Memory region 191 includes a p well 105 formed in epitaxial layer 108 and serving as a first p well region having a bottom plane 105b serving as a first bottom plane located at a first depth as measured from main surface 108f, an n well 113 formed in epitaxial layer 108 to surround p well 105 and serving as a second n well region having a bottom plane 113b serving as a second bottom plane located at a second depth less deep than the first depth, as measured from main surface 108f, and an n bottom well 102 provided in epitaxial layer 108 in contact with two bottom planes 105b and 113b and serving as a first bottom well region.

Logic circuit region 192 includes field effect transistors 131e–131j configuring a complementary field effect semiconductor element formed on main surface 108f of epitaxial layer 108.

Memory region 191 includes a memory element formed at p well 105. The memory element includes dynamic random access memory. The memory element includes capacitors 132a and 132b. The dynamic random access memory is configured of field effect transistors 131b and 131c and capacitors 132a and 132b connected thereto.

Logic circuit region 192 includes a p well 104 provided at epitaxial layer 108 and serving as a third p well region, and an n well 103 serving as a fourth n well region.

Logic circuit region 192 includes field effect transistors 131e, 131g and 131i formed at p well 104 and serving as a field effect transistor of the second conductivity type, and field effect transistors 131f, 131h and 131j formed at n well 103 and serving as a field effect transistor of the first conductivity type.

N well 103 surrounds p well 104. Logic circuit region 192 includes a bottom well 112 serving as a second p bottom well region in contact with p and n wells 104 and 103 at their respective bottom planes 104b and 103b.

Silicon substrate 109 is formed by cutting an ingot doped with boron having a concentration of $1\times10^{19}$ cm$^{-3}$. Thus silicon substrate 109 serving as a p substrate of high concentration underlies epitaxially grown layer 108. Epitaxial layer 108 has a boron concentration lower than silicon substrate 109. In other words, a wafer used to fabricate a device is provided in a combination of silicon substrate 109 heavily doped with boron and epitaxial layer 108 overlying silicon substrate 109 and lightly doped with boron.

Epitaxial layer 108 in a vicinity of its bottom is provided with bottom wells 102 and 112 having introduced therein phosphorus having a concentration of $1\times10^{17}$ to $1\times10^{18}$ cm$^{-3}$. Bottom wells 102 and 112 have a depth of 1.3 to 2 $\mu$m, as measured from main surface 108f to their bottom planes.

Memory region 191 is provided with a deep p well 105 and a less deep, n well 113. P well 105 contains an impurity of boron having a concentration of $1\times10^{17}$ to $1\times10^{18}$ cm$^{-3}$ and has a depth of 0.6 to 1.2 $\mu$m, as measured from main surface 108f to bottom plane 105b.

Adjacent to p well 105 an n well 113 is provided. N well 113 contains an impurity of phosphorus having a concentration of $1\times10^{17}$ to $1\times10^{18}$ cm$^{-3}$ and has a depth of 0.35 to 0.5 μm, as measured from main surface 108f to bottom plane 113b.

P well 105 has a surface provided with two field effect transistors 131b and 131c and capacitors 132a and 132b connected to field effect transistors 131b and 131c.

Field effect transistors 131b and 131c is configured of a gate electrode 6 formed on main surface 108f with a gate insulation film 5 posed therebetween, and n impurity regions 81 and 82 formed at p well 105 on opposite sides of gate electrode 6 and serving as source/drain regions containing an n impurity.

N impurity region 82 is connected to a bit line 18. Capacitors 132a and 132b is configured of a storage node 13, a dielectric film 14 formed thereon, and a cell plate 15 formed thereon. Storage node 13 is connected to n impurity region 81.

N well 113 has a surface provided with p impurity regions 91 and 92 serving as source/drain regions. Between p impurity regions 91 and 92 is provided gate electrode 6 with gate insulation film 5 posed therebetween. Gate electrode 6 has a sidewall covered with a sidewall oxide film 7.

Logic circuit region 192 is provided with n and p wells 103 and 104 opposite in conductivity, formed alternately. P and n wells 104 and 103 underlie field effect transistors 131e–131j. N field effect transistors 131e, 131g and 131i are configured of gate electrode 6 formed on p well 104 with gate insulation film 5 posed therebetween, and n impurity regions 95 and 96 formed at p well 104 on opposite sides of gate electrode 6 and serving as source/drain regions.

P field effect transistors 131f, 131h and 131j are configured of gate electrode 6 formed on n well 103 with gate insulation film 5 posed therebetween, and p impurity regions 91 and 92 provided on opposite sides of gate electrode 6 at n well 103 and spaced from each other, and serving as source/drain regions.

Main surface 108f is covered with an interlayer insulation film 102 and thereon is formed another interlayer insulation film 122 having a contact hole 16 allowing bit line 18 to be electrically connected to n impurity region 82. Interlayer insulation films 121 and 122 are provided with a contact hole 17 allowing storage node 13 to be connected to n impurity region 81.

N and p field effect transistors 131e and 131f form a CMOS. Similarly, p and n field effect transistors 131h and 131i form a CMOS.

The FIG. 1 semiconductor memory device includes memory and logic circuit regions formed on a single substrate to provide so-called, embedded random access memory (ERAM).

The FIG. 1 semiconductor memory device is fabricated in a method, as will be described hereinafter.

Figure 2:
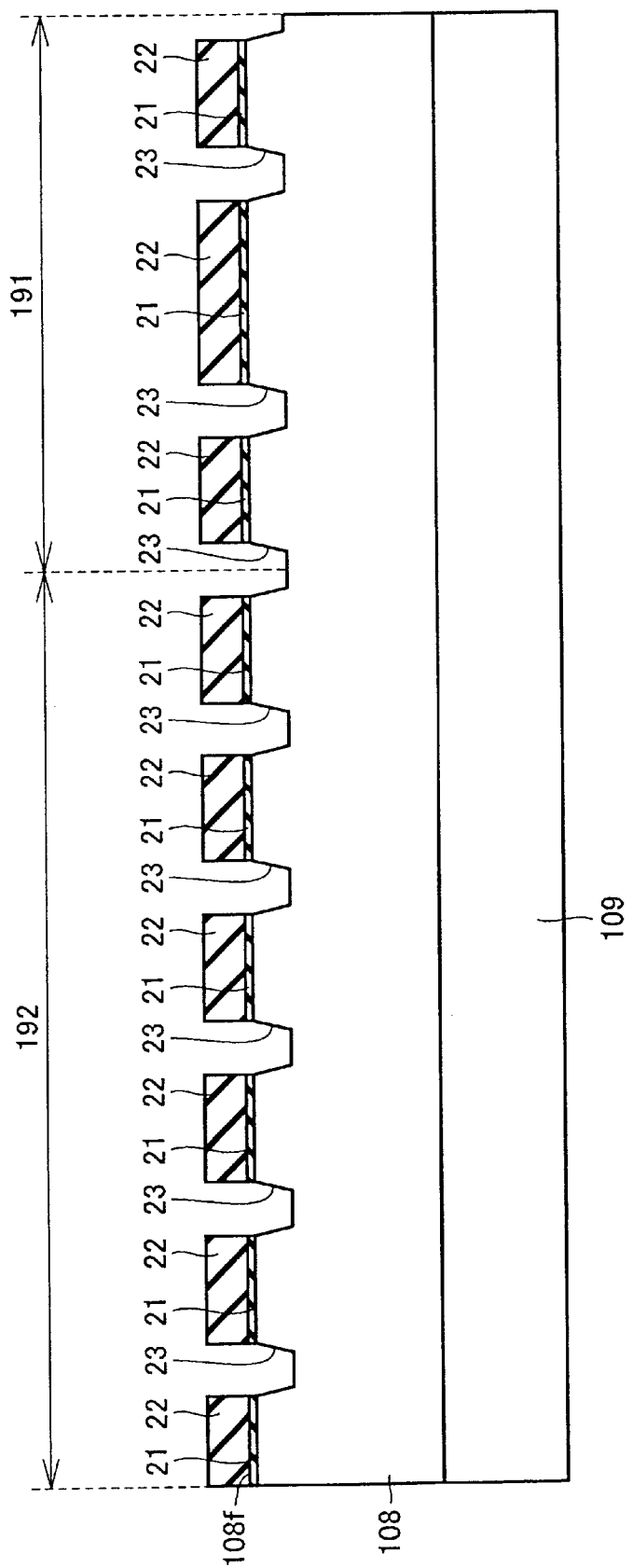
FIGS. 2–10 illustrate first to ninth steps of a method of manufacturing the FIG. 1 semiconductor device, as seen in cross section.

With reference to FIG. 2, boron-doped silicon substrate 109 is provided on a surface thereof with epitaxially grown, boron-doped layer 108.

Epitaxial layer 108 is provided on main surface 108f with a silicon oxide film 21 and a silicon nitride film 22 successively stacked. Silicon oxide film 21 is 5 to 30 nm thick and silicon nitride film 22 is 100 to 300 nm thick. Silicon nitride film 22 is provided thereon with a resist pattern and in accordance with the resist pattern silicon nitride and oxide films 22 and 21 are etched and thus patterned, as shown in FIG. 2. Silicon nitride and oxide films 22 and 21 are used as a mask to etch epitaxial layer 108 to form a trench 23 of 200 to 500 nm in width and 150 to 500 nm in depth.

Figure 3:
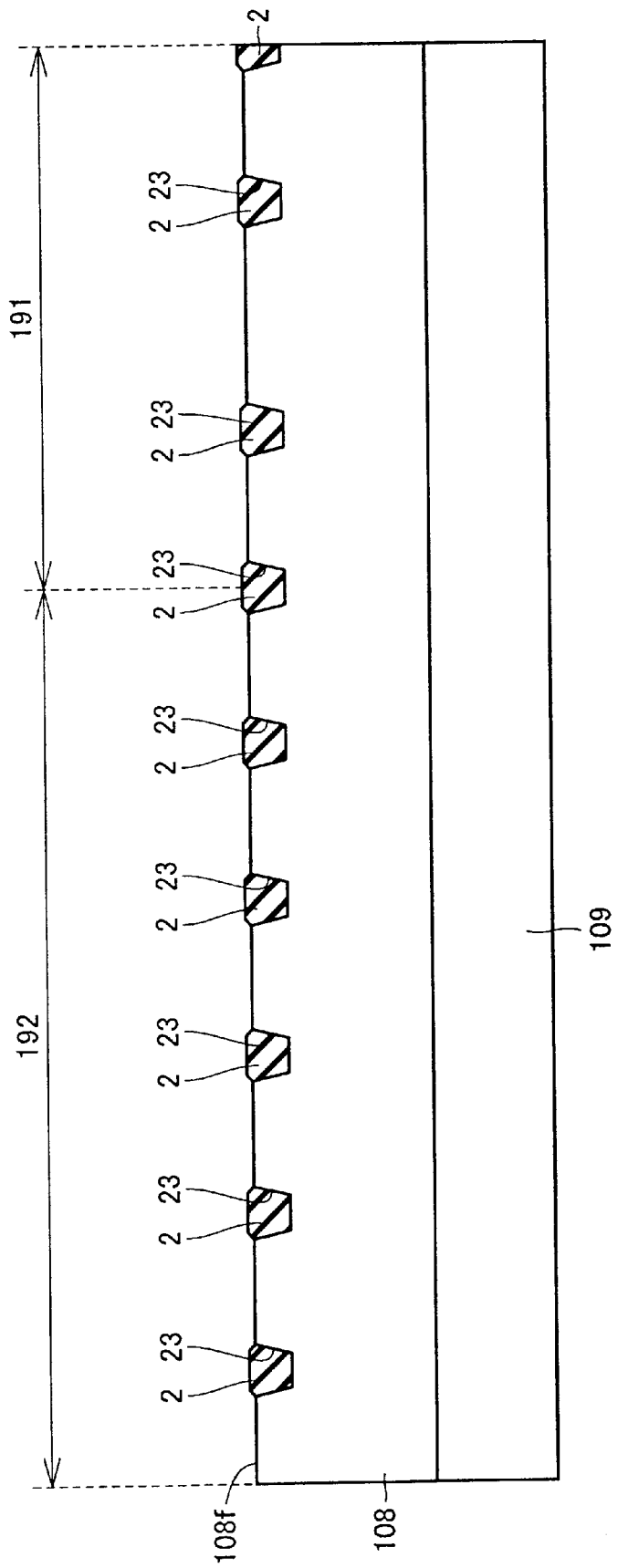

With reference to FIG. 3, low-pressure chemical vapor deposition (CVD) is employed to form an insulation film of silicon oxide film to have a thickness of 300 to 800 nm. The silicon oxide film fills trench 23. Silicon nitride film 22 is used as a stopper in chemical mechanical polishing (CMP) to remove silicon oxide film from a surface of silicon nitride film 22. Furthermore, the silicon oxide film is left in trench 23 and internal to an opening of silicon nitride film 22. Thermal phosphoric acid is then used to wet-etch silicon nitride film 22 away and silicon oxide film 21 is then removed to provide an isolation and insulation film 2, as shown in FIG. 3.

Figure 4:
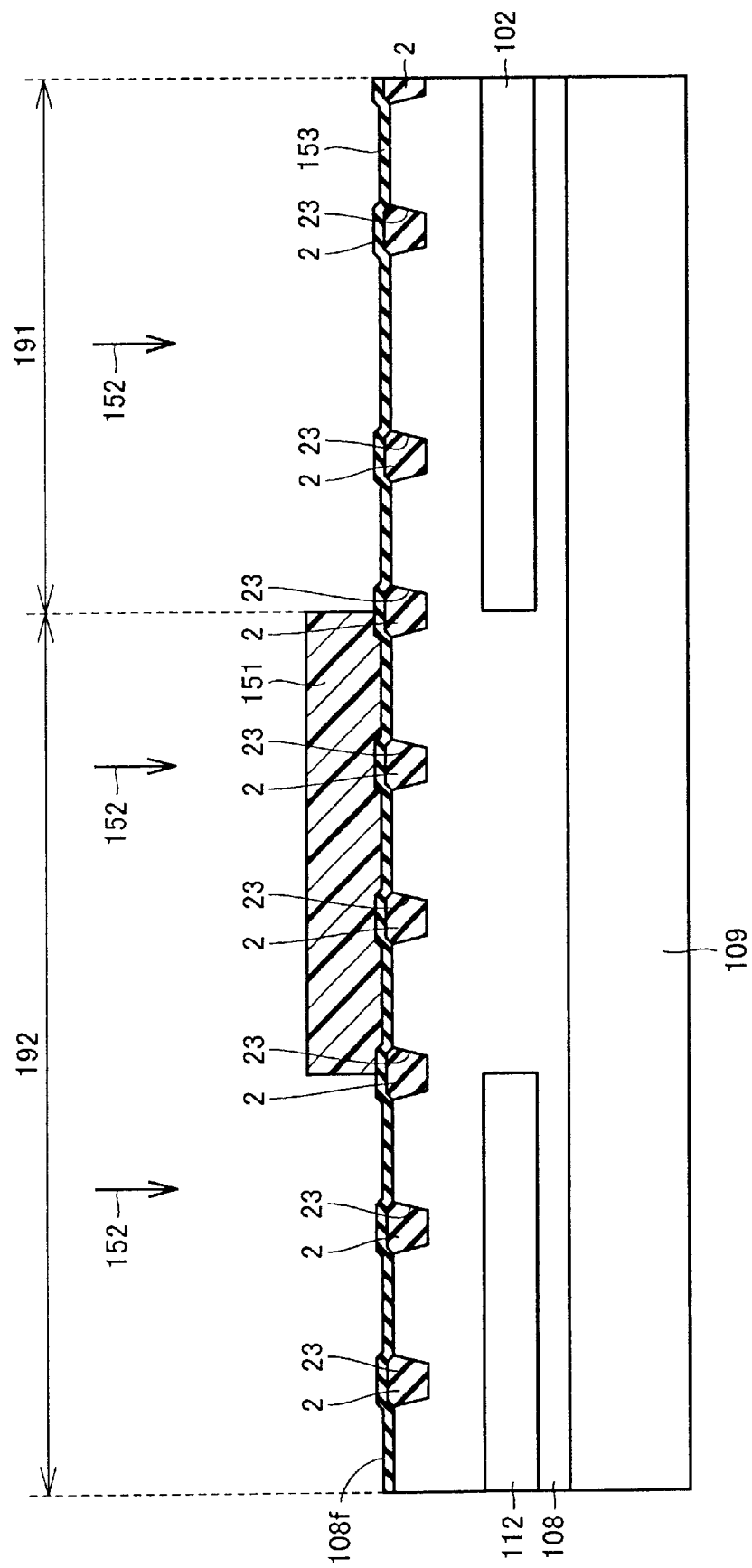

With reference to FIG. 4, main surface 108f is thermally oxidized to provide a silicon oxide film 153 of approximately 10 nm in thickness. Silicon oxide film 153 is provided thereon with a resist pattern 151 which is in turn used as a mask to introduce phosphorous of $5\times10^{12}$ to $5\times10^{13}$ cm$^{-2}$ in a direction as indicated by an arrow 152 with energy of 1.2 MeV to 2.3 MeV applied to form bottom wells 102 and 112.

Figure 5:
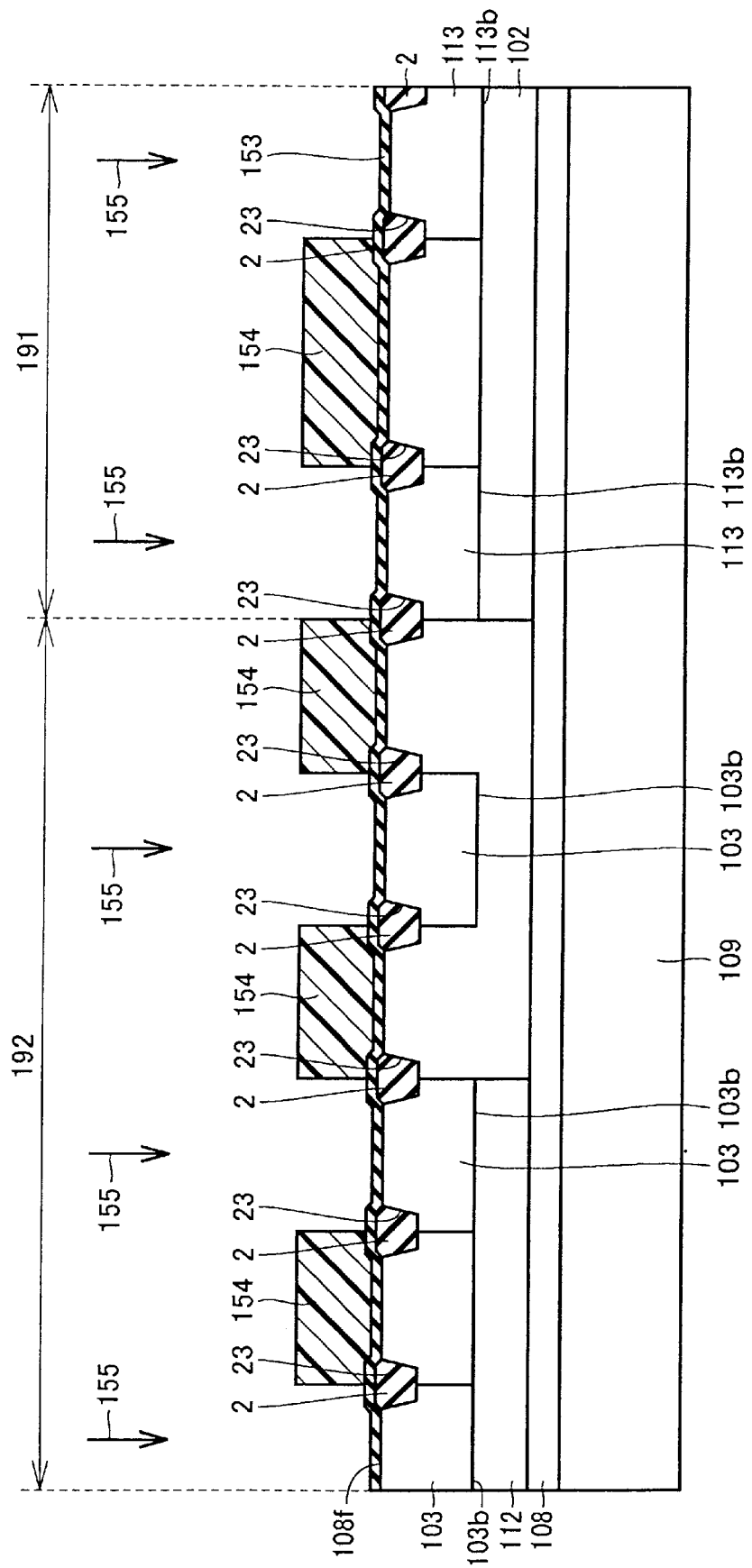

With reference to FIG. 5, silicon oxide film 153 is provided thereon with a resist pattern 154 which is in turn used as a mask to introduce phosphorus of $5\times10^{12}$ to $15\times10^{13}$ cm$^{-2}$ into epitaxial layer 108 in a direction as indicated by an arrow 155 with energy of 300 keV to 400 keV applied to form n wells 103 and 113.

Figure 6:
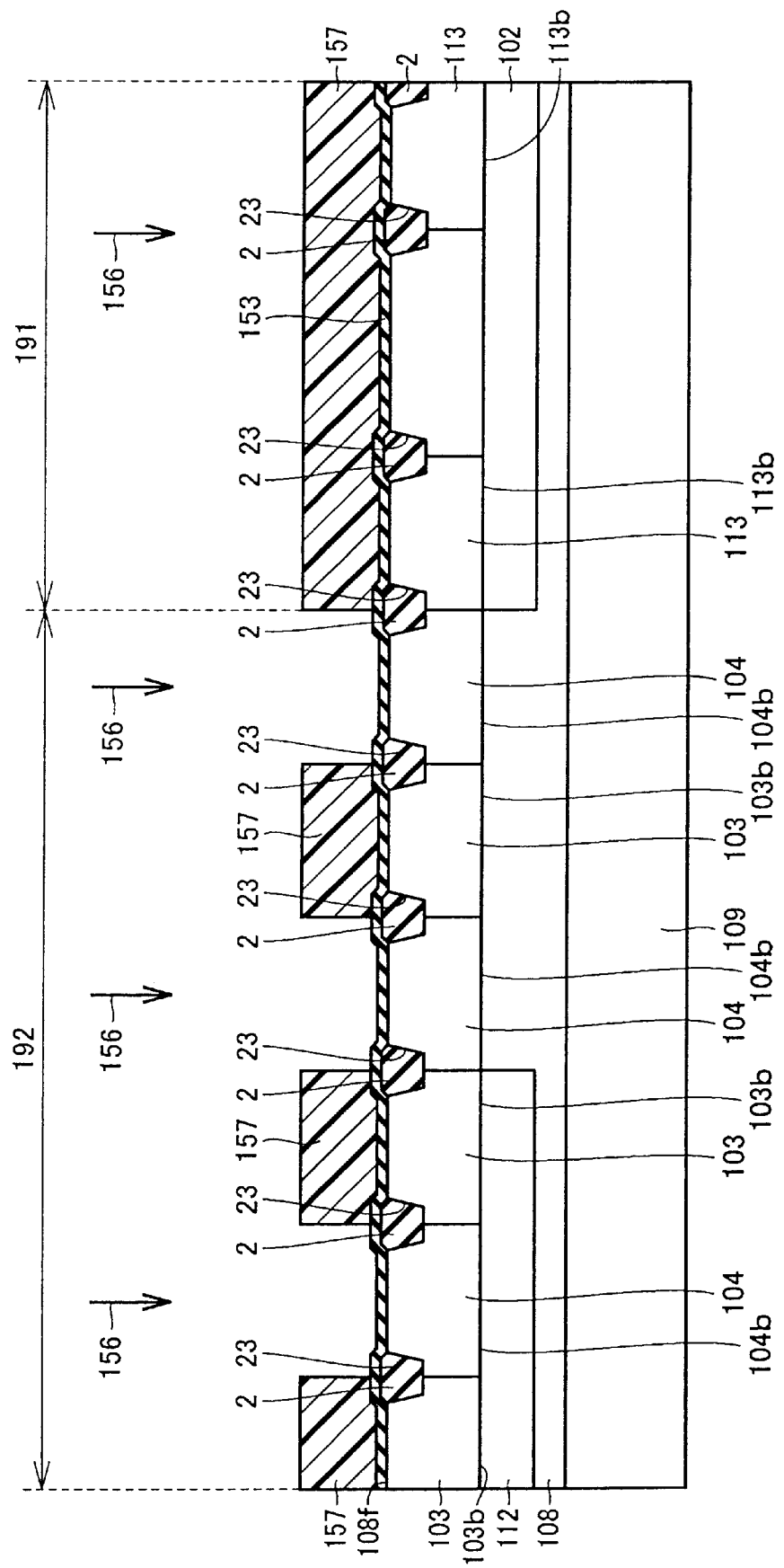

With reference to FIG. 6, silicon oxide film 153 is provided on a surface thereof with a resist pattern 157. Resist pattern 157 is formed on n wells 103 and 113. Resist pattern 157 is used as a mask to introduce boron of $5\times10^{12}$ to $5\times10^{13}$ cm$^{-2}$ into epitaxial layer 108 in a direction as indicated by an arrow 156 with energy of 200 keV to 300 keV applied to provide p well 104.

Figure 7:
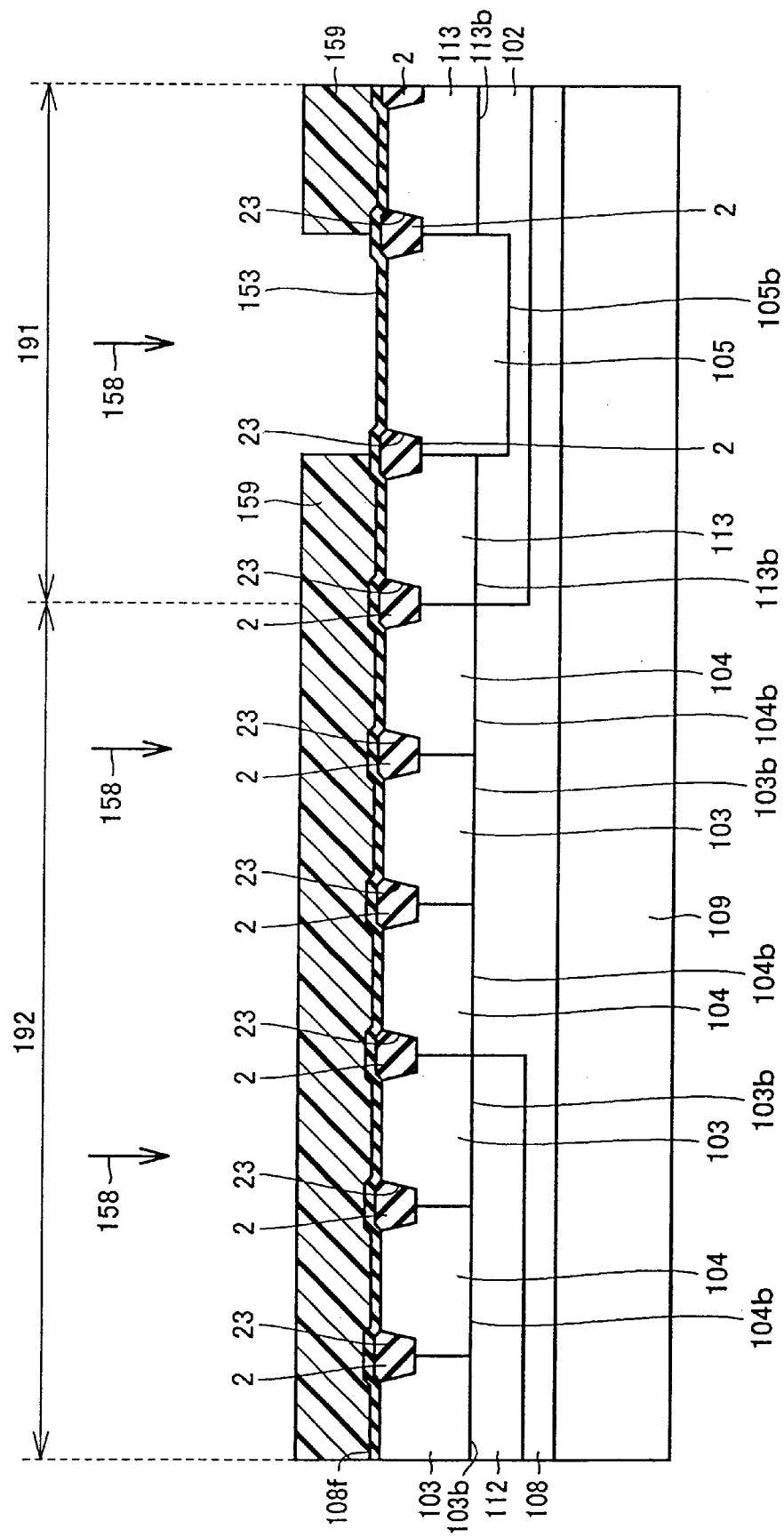

With reference to FIG. 7, silicon oxide film 153 is provided thereon with a resist pattern 159 which is in turn used as a mask to introduce boron of $5\times10^{12}$ to $5\times10^{13}$ cm$^{-2}$ into epitaxial layer 108 in a direction as indicated by an arrow 158 with energy of 250 keV to 600 keV applied to provide p well 105.

Figure 8:
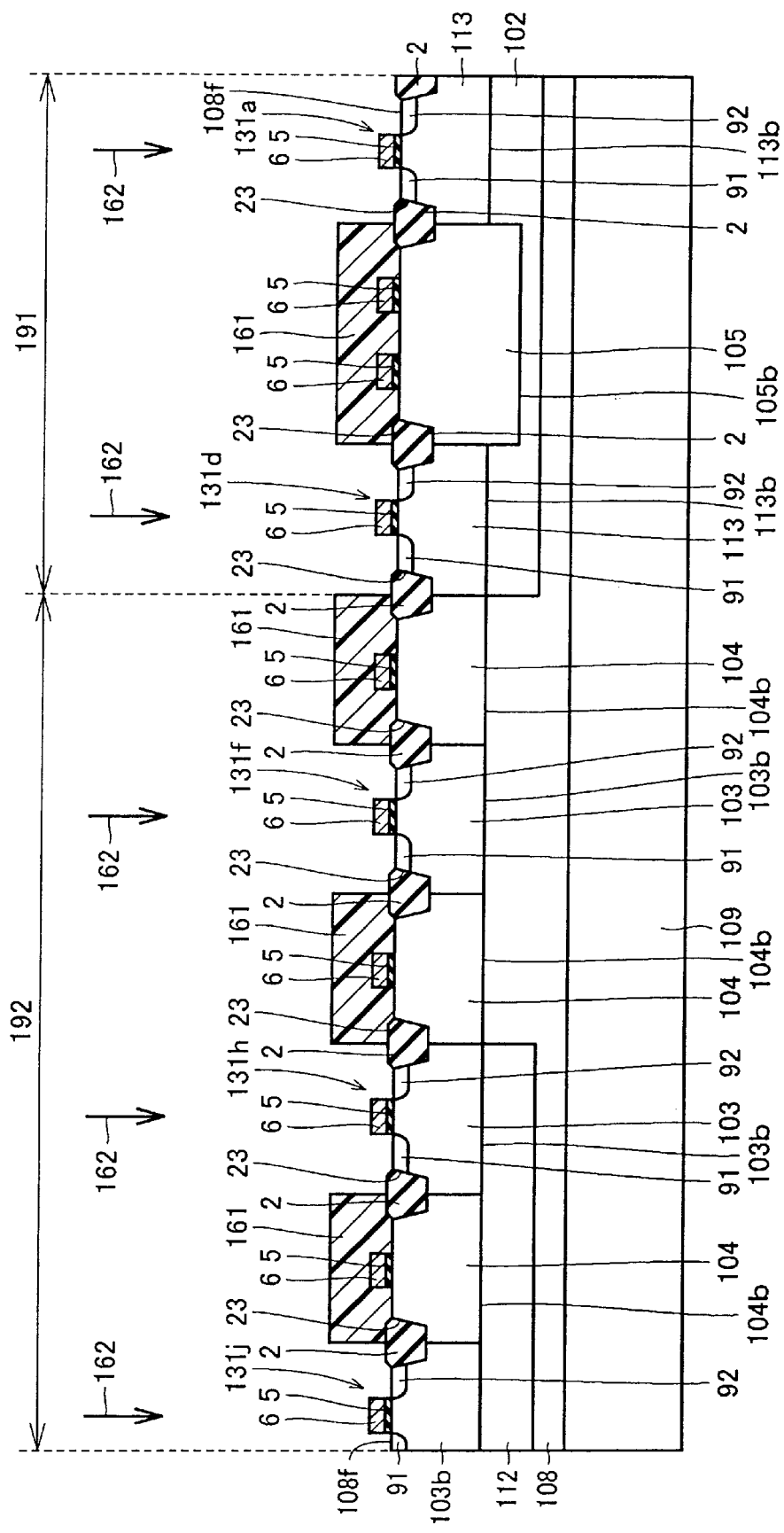

With reference to FIG. 8, silicon oxide film 153 is removed and thereafter on p wells 104 and 105 a resist pattern 160 is provided and used as a mask to introduce boron into epitaxial layer 108 in a direction as indicated by an arrow 162 to provide p impurity regions 91 and 92 on opposite sides of gate electrode 6 to serve as source/drain regions.

Figure 9:
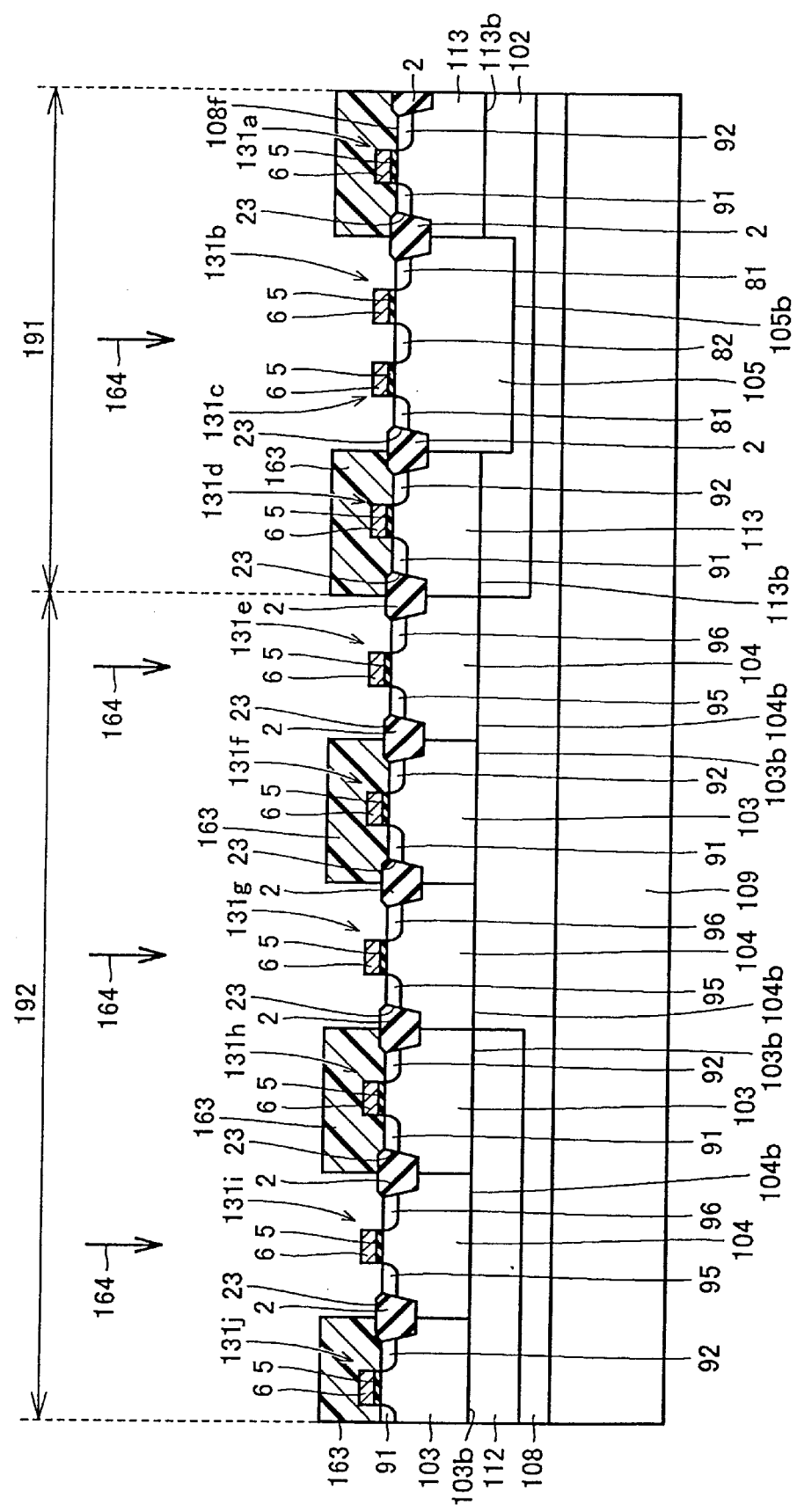

With reference to FIG. 9, n wells 103 and 113 are provided thereon with a resist pattern 163 which is in turn used as a mask to introduce phosphorus into epitaxial layer 108 in a direction as indicated by an arrow 164 to provide n impurity regions 81, 82, 95 and 96 to serve as source/drain regions.

Figure 10:
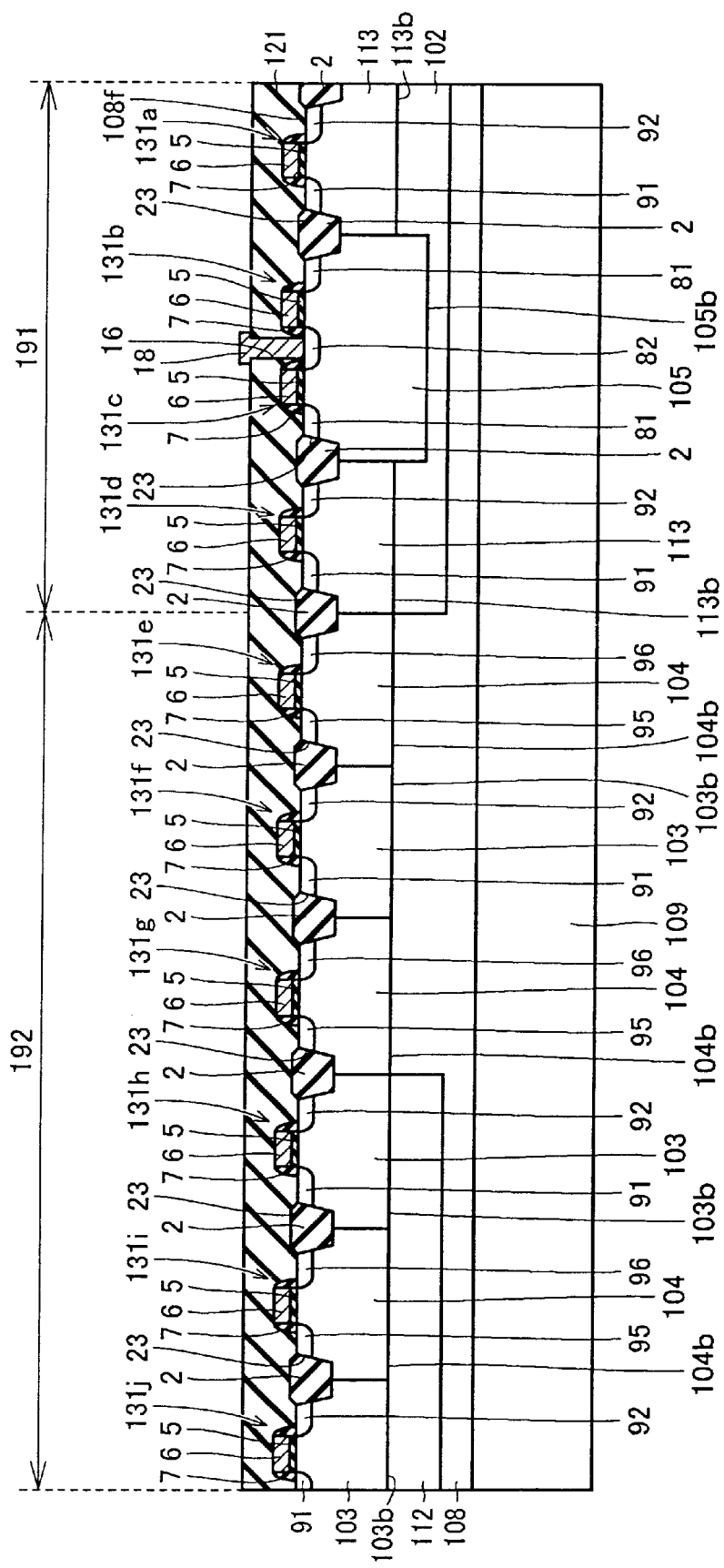

With reference to FIG. 10, main surface 108f is covered with a silicon oxide film and the silicon oxide film has an entire surface thereof etched back to provide sidewall oxide film 7. To cover sidewall oxide film 7 and gate electrode 6 main surface 108f is provided thereon with interlayer insulation film 121. On interlayer insulation film 121 a resist pattern is provided and in accordance with the resist pattern interlayer insulation film 121 is etched to provide a contact hole 16 reaching n impurity region 82. Contact hole 16 is filled with a doped polysilicon layer which is in turn patterned to provide bit line 18.

With reference to FIG. 1, interlayer insulation film 121 is provided thereon with interlayer insulation film 122. On interlayer insulation film 122 a resist pattern is provided and in accordance with the resist pattern interlayer insulation films 122 and 121 are etched to form a contact hole 17 reaching n impurity region 81. Contact hole 17 is filled with a doped polysilicon layer which is in turn patterned, as prescribed, to form storage node 13. On storage node 13 a dielectric film and a doped polysilicon layer are provided and then patterned, as prescribed, to provide dielectric film 14 and cell plate 15 to configure capacitors 132a and 132b to complete the FIG. 1 semiconductor memory device.

When the process as described above is employed to provide a semiconductor memory device of the present invention in the first embodiment, first of all, p well 105 is surrounded by n well 113 and bottom well 102 to provide a triple well structure. Thus in p well 105 potential can be set, as desired, and soft error can thus be reduced.

Furthermore, p well 105 has bottom plane 105b located deeper than bottom plane 113b of n well 113. P well 105 thus formed deep can prevent p well 105 from losing data and thus enhance characteristics for refreshing.

Furthermore, silicon substrate 109 heavily doped with boron underlies epitaxial layer 108 lightly doped with boron and epitaxial layer 108 underlies a DRAM and a CMOS. The DRAM can thus be configured of capacitors 132a and 132b and field effect transistors 131b and 131c effectively free of soft error. Furthermore, with logic circuit region 192 having a plurality of filed effect transistors forming a CMOS, providing the CMOS on a wafer having such a dual layer structure can prevent latch-up to provide a highly reliable semiconductor device. The CMOS can be reduced in layout and the semiconductor memory device can generally be microfabricated.

Second Embodiment

Figure 11:
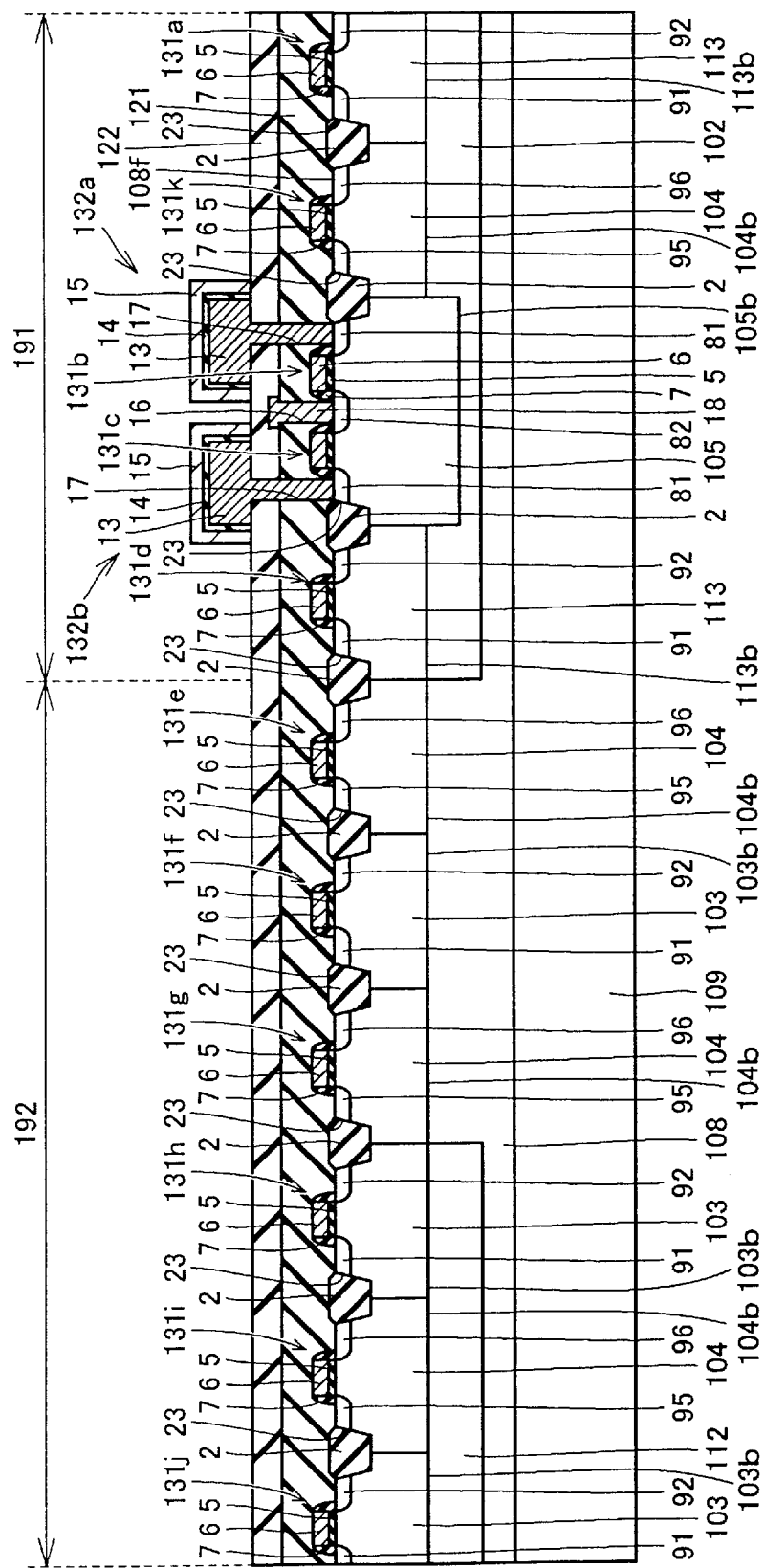
FIG. 11 is a cross section of the semiconductor memory device of the present invention in a second embodiment.

With reference to FIG. 11, the present invention in a second embodiment provides a semiconductor memory device distinguished from the semiconductor memory device of the first embodiment in that p well 104 is provided in memory region 191 between n and p wells 113 and 105. P well 104 is configured to be similar to p well 104 of logic circuit region 192 and has a surface provided with n impurity regions 95 and 96 serving as source/drain regions. Between n impurity regions 95 and 96 on main surface 108f gate electrode 6 is provided, with gate insulation film 5 posed therebetween. Gate electrode 6 and n impurity regions 95 and 96 form an n field effect transistors 131k.

Figure 12:
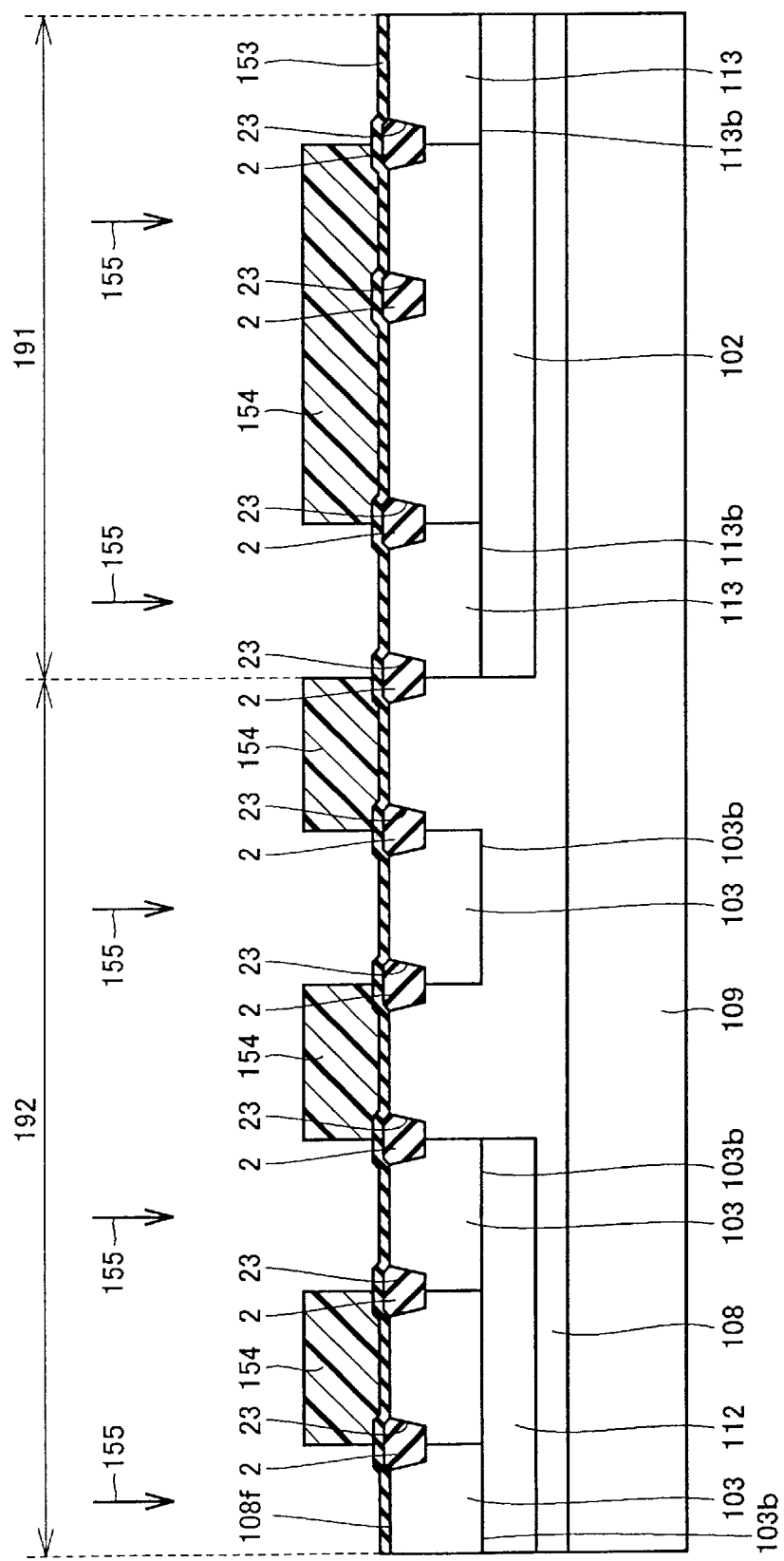
FIGS. 12 and 13 illustrate first and second steps of a method of manufacturing the FIG. 11 semiconductor device, as seen in cross section.

The FIG. 11 semiconductor memory device is fabricated in a method, as described hereinafter. With reference to FIG. 12, in the method as described in the first embodiment at a step corresponding to FIG. 5 memory region 191 is provided with a wide resist pattern 154 which is in turn used as a mask to introduce phosphorus, as has been described in the first embodiment, in a direction indicated by an arrow 155 to provide n wells 103 and 113.

Figure 13:
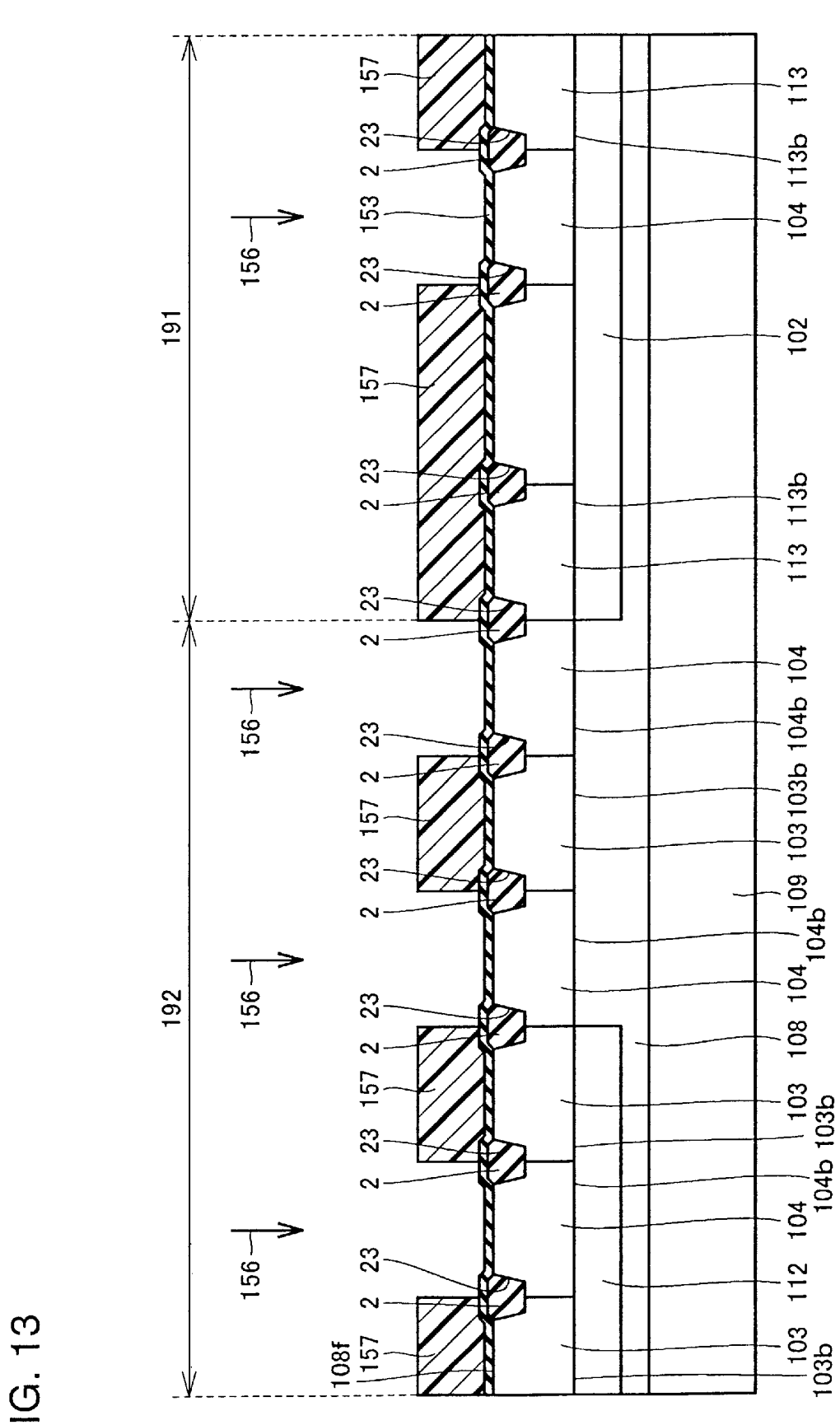
Figure 14:
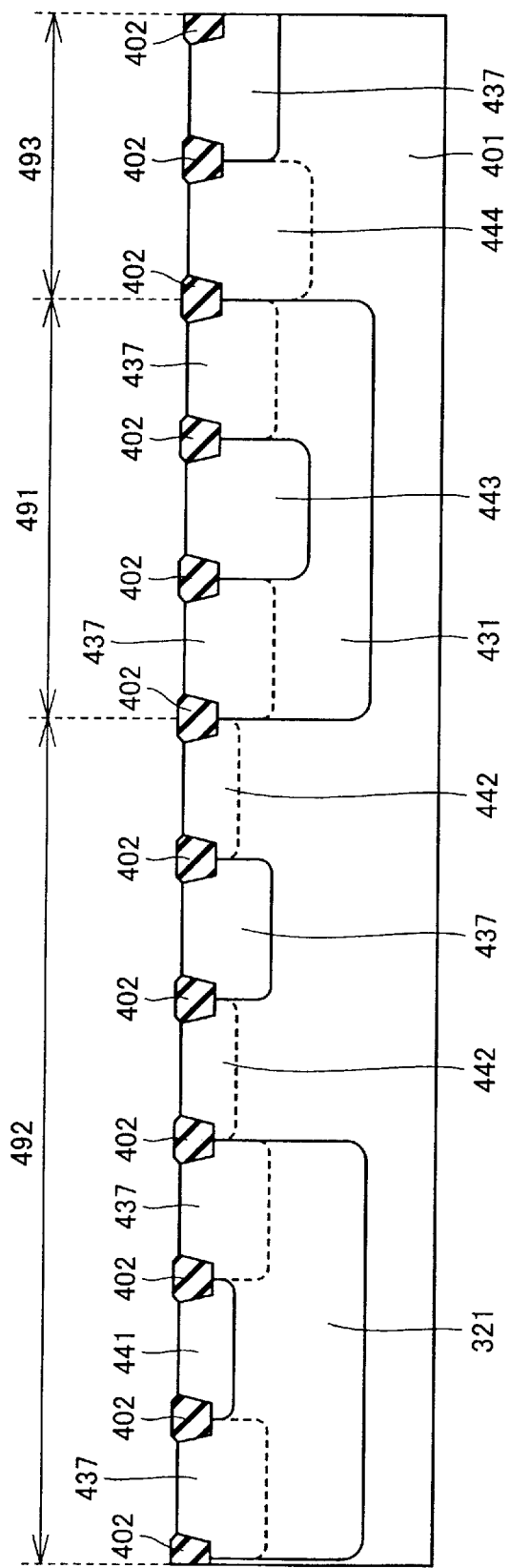
FIG. 14 is a cross section of a conventional semiconductor memory device.

Then, with reference to FIG. 13, at a step corresponding to that as described in the first embodiment with reference to FIG. 6 a resist pattern 157 is provided on n well 103 and a region in which p well 105 is later formed. Resist pattern 157 is used as a mask to introduce boron, as has been described in the first embodiment, in a direction indicated by an arrow 156 to provide p well 104. Then a process similar to that described in the first embodiment is followed to complete the FIG. 1 semiconductor device.

The second embodiment can also provide as effective a semiconductor memory device as the first embodiment.

The embodiments of the present invention described above are variable. Initially while in the embodiments p and n impurities are of first and second conductivities, respectively, they may be opposite, i.e., of second and first conductivities, respectively. In this case, silicon substrate 109 is doped with an n impurity. Furthermore, while memory region 191 in the embodiments is provided with DRAM, it may alternatively be provided with a static semiconductor memory device, a non-volatile semiconductor memory device or the like.

The present invention can thus provide a highly reliable semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a semiconductor substrate containing an impurity of a first conductivity type having a first concentration;

a semiconductor layer formed on said substrate, having a main surface, and containing an impurity of the first conductivity type having a second concentration lower than said first concentration;

a memory region provided on said semiconductor layer; and a logic circuit region provided on said semiconductor layer at a location different from said memory region, said memory region including a first well region of the first conductivity type formed at said semiconductor layer and having a first bottom plane at a first depth as measured from said main surface, a second well region of a second conductivity type formed at said semiconductor layer to surround said first well region and having a second bottom plane at a second depth less deep than said first depth, as measured from said main surface, and a first bottom well region of the second conductivity type provided at said semiconductor layer in contact with said first and second bottom planes, said logic circuit region including a complementary field effect semiconductor element formed on a main surface of said semiconductor layer.

2. The semiconductor memory device according to claim 1, wherein said memory region includes a memory element formed at said first well region.

3. The semiconductor memory device according to claim 2, wherein said memory element includes dynamic random access memory.

4. The semiconductor memory device according to claim 2, wherein said memory element includes a capacitor.

5. The semiconductor memory device according to claim 1, wherein said logic circuit region includes a third well region provided at said semiconductor region and having the first conductivity type and a fourth well region having the second conductivity type.

6. The semiconductor memory device according to claim 5, wherein said logic circuit region includes a field effect transistor formed at said third well region and having the second conductivity type and a field effect transistor formed at said fourth well region and having the first conductivity type.

7. The semiconductor memory device according to claim 5, wherein said fourth well region surrounds said third well region and said logic circuit region includes a second bottom well region provided in contact with said third and fourth well region at their respective bottomed planes and having the second conductivity type.

* * * * *